United States Patent [19] [11] 4,076,363
Péchard et al. [45] Feb. 28, 1978

[54] FASTENING AND LOCKING DEVICE

[75] Inventors: Lucien Leon Péchard, Dole; Bernard André Logerot, Montbarrey, both of France

[73] Assignee: Bunker Ramo Corporation, Oak Brook, Ill.

[21] Appl. No.: 732,016

[22] Filed: Oct. 13, 1976

[51] Int. Cl.[2] ........................ H01R 13/54; H05K 1/12
[52] U.S. Cl. ................................ 339/91 R; 24/213 B
[58] Field of Search ............... 339/91 R, 17 C, 256 R, 339/256 S, 256 SP, 217 S; 24/213 B, 73 PF, 73 MF, 73 PM, 73 SC, 73 FT, 73 SM; 85/5 R, 17, 80; 317/101 C, 101 DH

[56] References Cited

U.S. PATENT DOCUMENTS

| | | | |
|---|---|---|---|
| 2,096,319 | 10/1937 | Churchill | 24/213 B X |
| 2,144,885 | 1/1939 | MacFadden | 24/213 B |
| 2,800,698 | 7/1957 | Wood | 24/213 B X |

*Primary Examiner*—Roy Lake
*Assistant Examiner*—E. F. Desmond
*Attorney, Agent, or Firm*—William Lohff; R. O. Gray; F. M. Arbuckle

[57] ABSTRACT

A fastening and locking device which can rapidly join two elements together in a secure manner. The device comprises a male part on one of the elements and a receiving channel for the male part on the other of the elements.

2 Claims, 2 Drawing Figures

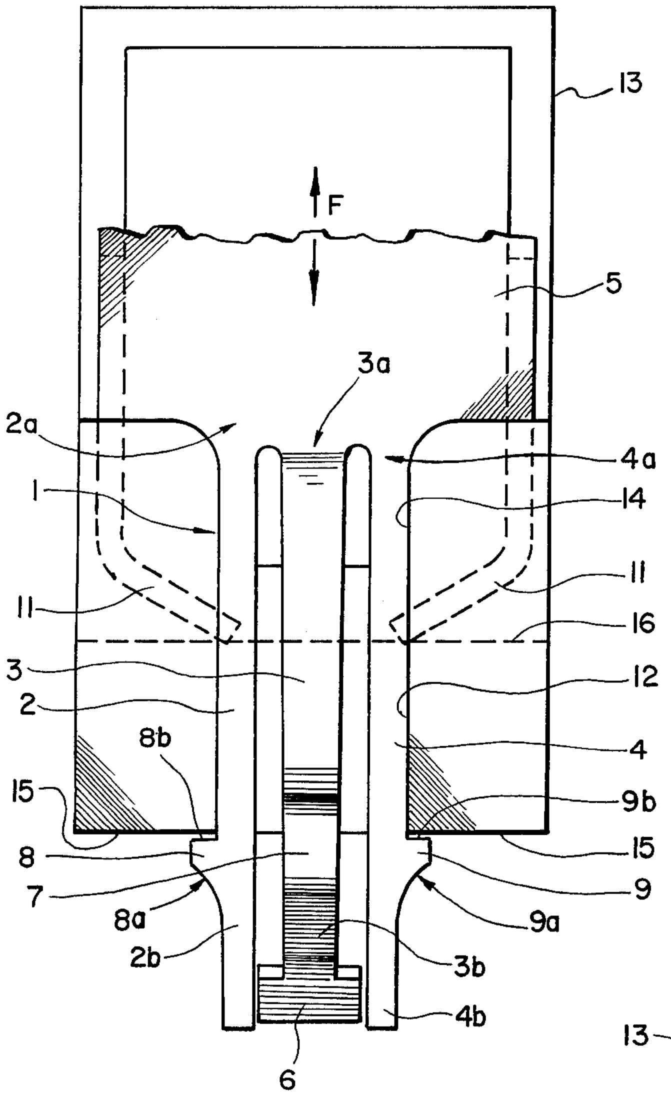
Fig.1.
Fig.2.
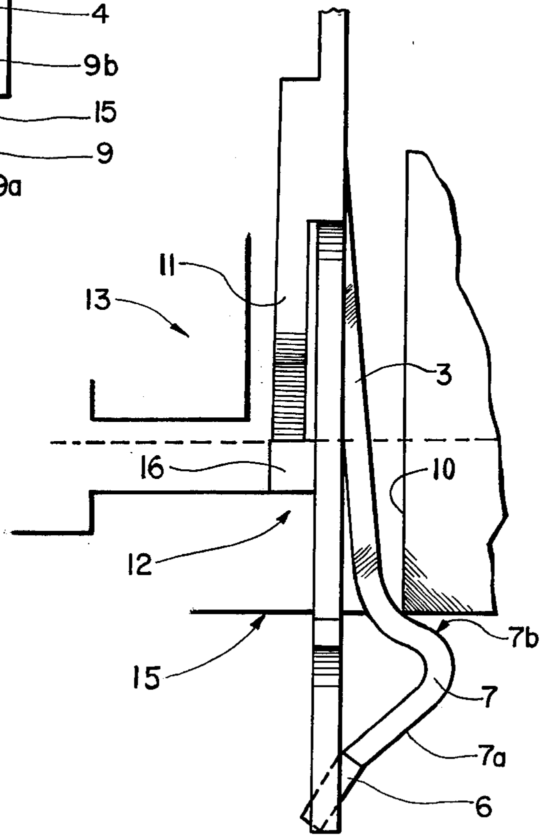

FASTENING AND LOCKING DEVICE

BACKGROUND OF THE INVENTION

1 Field of the Invention

This invention relates to a fastening and locking device which can rapidly join two elements together in a secure manner. The device comprises a male part on one of the elements and a receiving channel for the male part in the other of the elements.

2 Description of the Prior Art

In the electronic industry, especially when multiple contact elements are used, it is often necessary to make quick contact with a contact element on the chassis of an apparatus or on a card bearing multiple wiring connections, such as a printed circuit board.

When a connection is to be made to the apparatus, for example to a printed circuit board, sometimes the delicate nature of the receiving element makes it difficult to effect secure mechanical and electrical connection due to the delicate nature of the element in the apparatus receiving the connection.

One of the primary means of attaching a wire, for example, to an apparatus is by means of screws, rivets, or bolts, all of which require long assembly time for mounting, and make removal of the wire connection to the apparatus difficult. Alternatively, there are on the market quick connect devices, called harpoons in the trade, which are attached to the end of a wire and are forced into a receiving channel in the apparatus and held by some form of latch on the harpoon. However, such prior art harpoon devices do not assure a precise positioning of the harpoon in the channel of the receiving device and do not assure a firm mechanical hold between the two connecting elements.

In this field of the art, there is known a rapid fastening device for a connector which comprises a harpoon-like male element penetrating into an orifice made in the anterior surface of a wall of the receiving element, and locked into place by clamping barbs to the posterior surface wall of the receiving element. In such a structure, a V-shaped pair of arms is provided, the first arm entering substantially perpendicular to the connector body and assuring proper positioning of the male member, and a second arm effecting the locking action to the posterior surface wall, the two arms being connected together by means of elastic articulation.

Such a device as just described presents at least two major difficulties: it must be molded into a rather larger connector body of relatively substantial dimensions in order to withstand handling; and the shape of the male part must correspond to the form and dimension of the receiving orifice. In other words, a rectangular-shaped "harpoon" will not be effective to ensure proper fixation and locking into place within a round hole. Rather, it is necessary that the harpoon also be round in shape, thereby requiring a specific mold for its manufacture.

SUMMARY OF THE INVENTION

The present invention provides a fastening and locking device which is able to effect a rapid fixation and automatic locking of the male part in a receiving connector, with the concomitant features of being low in cost, easy to manufacture, able to be adapted to be received in a variety of shaped receiving elements, and being capable of effecting extremely quick latching capabilities while being relatively easy to dismount from its receiving member. According to the invention, there is provided a male part in the form of a "harpoon" consisting of three parallel flexible blades connected at their fixed extremities by a common band of sheet material, and separated at their other extremities with the middle blade having a T-shaped end portion which, in the position of rest of the male part, lies in the plane of and maintains separation between the two lateral blades. When the middle blade is flexed out of the plane of the other two blades, the cross arm of the T is moved out from between the two lateral blades so as to allow the two lateral blades to be moved toward one another in a "pinching" action. Adjacent the free ends of the lateral two blades are locking shoulders which can lock against the posterior end of the receiving channel for the male part. After complete insertion of the male part, the two lateral blades return to their normal positions to latch the shoulders in place.

The male part also comprises, on the band of sheet material joining the fixed ends of the blades, bendable wing portions for meeting with a stop in the receiving channel so as to limit the amount of penetration of the male part into the receiving channel.

The device according to the subject application has numerous advantages as compared with known devices in that it can be manufactured by simple cutting and stamping techniques from a single sheet of metal thereby maintaining low weight, small dimensions, and low production cost. Because of the cooperation between the wing members and the locking shoulders, the male part is adaptable to several forms of receiving channels without allowing excessive play of one element with the other, and consequently it is possible to maintain precise positioning in the fastened position. Fastening of the male part with the receiving element is quickly achieved, and the latching of the locking shoulders against the posterior part of the receiving channel is automatic. Additionally, removal of the male part is easily achieved by bending the middle blade so as to remove the T from the space between the ends of the two lateral blades, after which pinching of the lateral blades permits passage of the locking shoulders within the receiving channel in a removing direction.

BRIEF DESCRIPTION OF THE DRAWINGS

The invention will now be described in detail with reference to the accompanying drawings representing a preferred embodiment of the present invention. In the drawings:

FIG. 1 is a view of one of the flat sides of the fastening device mounted in a receiving element; and FIG. 2 is a side view of the device of FIG. 1.

The fastening device of the invention comprises a harpoon-shaped male part 1 and a receiving carrier element 13. The male part 1 is of sheet metal and consists of three parallel flexible blades 2, 3, and 4. The two lateral blades 2 and 4 are spaced from the middle blade 3, the three blades being joined at their extremities 2*a*, 3*a*, 4*a* by a band of sheet material 5, and free at their other ends 2*b*, 3*b*, 4*b*. Lateral blades 2 and 4 are in the same plane as the band 5, while middle blade 3 forms a small predetermined angle (see FIG. 2) with the plane. A bulge 7 is configured toward the free end 3*b* of blade 3, and the extreme end of blade 3 is shaped in the form of an inverted T shown at 6 in the drawings.

In the rest position, the T 6 maintains separation between the two lateral blades 2 and 4. When displaced by bending of blade 3, the T 6 moves out of the plane of the lateral blades 2 and 4 to thereby permit flexure of the two blades 2 and 4 toward one another.

Near the free end of each blade 2 and 4 and on side opposite the middle blade 3, is a locking shoulder having an inclined leading edge 8a and 9a and a flat latching shoulder 8b and 9b. When in fully assembled position in the receiving channel 14, latching shoulders 8b and 9b are latched against the posterior surfaces 15 of the receiving channel 14. In order to improve the stability of the male part 1 within the receiving channel 13, band 5 comprises two wing elements II which are capable of bending upwardly as viewed in FIG. 1.

A stop 16 is provided in receiving element 13, the stop being in the form of a groove in the receiving element 13 or a ledge therein so as to limit the penetration depth of the male part 1. Thus, the combination of the action of the wing elements II and the locking shoulders 8, 9, the male part is securely fastened and locked into position within the receiving element.

The male part 1 is fastened to the receiving element 13 by positioning the male part 1 opposite the receiving channel 14 and sliding the free ends 2b, 3b, 4b of the blades 2, 3, and 4 downwardly as viewed in FIG. 1. The inclined part 7a of the bulge 7, upon application of a force F is cammed toward the left as viewed in FIG. 2 against cam surface 10 in the receiving element 13. This action displaces the middle blade 3 toward the left and consequently the T 6 out from between the free ends of lateral blades 2 and 4.

Upon continued application of insertion force F, the lateral blades 2 and 4 are cammed together by the action of the inclined parts 8a and 9a and the sides 12 of the receiving channel 14 in a kind of a pinching action. At the depth of penetration which permits the lateral blades 2 and 4 to spring outwardly into a latched position, bulge 7 is freed of cam surface 10, T 6 again moves to the plane of the ends of lateral blades 2 and 4, and wing elements II are biased into form engagement with the stop 16.

In order to remove male part 1, the T 6 is displaced until it is out of the plane of lateral blades 2 and 4, the lateral blades are then pinched together so as to clear shoulders 8 and 9 from the posterior surface 15 of receiving channel 14, thereby permitting the male part to pass in reverse direction through the receiving channel 14.

From the foregoing, it can be easily realized that this invention can assume various embodiments. Thus, it is to be understood that the invention is not limited to the specific embodiments described herein, but is to be limited only by the appended claims.

The embodiments of the invention in which an exclusive property or privilege is claimed are defined as follows:

1. A fastening and locking device for securing and locking together two elements, including a male part on one of the elements and a receiving opening in the other of said elements, the improvement wherein said male part comprises three flexible parallel blades having fixed ends connected to a common strap element and separated at their other ends, the middle blade terminating with a T-shaped portion which, in the rest position of the device lies in the plane of the two lateral blades and maintains a predetermined spacing between said two lateral blades, said other end of said middle blade being bendable out of the plane of said two lateral blades so as to move said T-shaped portion from between said lateral blades to allow a pinching together of the lateral blades toward each other, said lateral blades each comprising on their outer edges a locking shoulder which engages with the posterior surface of said receiving opening after insertion of said male part into said opening and said lateral blades return to their rest positions, and said male part further comprising a pair of depending taps which lie in a plane parallel to and spaced apart from said plane of said lateral blades and including inwardly folded portions for engaging a stop shoulder in said other element to limit the penetration of said male part into said opening and to assist in locking said elements together.

2. The fastening and locking device as claimed in claim 1, wherein said middle blade has a bulge near its free end but inwardly of said T-shaped portion, and said other element has a wall portion adapted to cam against said bulge to effect said bending of said middle blade.

* * * * *